United States Patent
Yun et al.

(10) Patent No.: US 8,367,533 B2
(45) Date of Patent: Feb. 5, 2013

(54) SEMICONDUCTOR DEVICES INCLUDING DOPED METAL SILICIDE PATTERNS AND RELATED METHODS OF FORMING SUCH DEVICES

(75) Inventors: Jung-Ho Yun, Gyeonggi-do (KR); Gil-heyun Choi, Seoul (KR); Jong-Myeong Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/152,406

(22) Filed: Jun. 3, 2011

(65) Prior Publication Data

US 2011/0237058 A1   Sep. 29, 2011

(30) Foreign Application Priority Data

May 28, 2007   (KR) .............................. 2007-0051555

(51) Int. Cl.
*H01L 21/8238* (2006.01)
(52) U.S. Cl. . 438/561; 257/377; 257/384; 257/E29.156; 257/E21.144; 257/E21.151
(58) Field of Classification Search .................. None
See application file for complete search history.

(56) References Cited

U.S. PATENT DOCUMENTS

| | | | |
|---|---|---|---|
| 5,470,791 A | 11/1995 | Suguro et al. | |
| 5,956,584 A | 9/1999 | Wu | |
| 5,981,380 A | 11/1999 | Trivedi et al. | |
| 6,271,122 B1 | 8/2001 | Wieczorek et al. | |
| 6,342,441 B1 | 1/2002 | Park et al. | |
| 6,426,291 B1 * | 7/2002 | Hu et al. | 438/682 |
| 6,555,438 B1 | 4/2003 | Wu | |
| 7,329,582 B1 * | 2/2008 | Pan et al. | 438/300 |
| 2001/0030366 A1 * | 10/2001 | Nakano et al. | 257/758 |
| 2002/0005553 A1 * | 1/2002 | Ootsuka et al. | 257/369 |
| 2004/0147082 A1 * | 7/2004 | Kim | 438/301 |
| 2005/0045965 A1 | 3/2005 | Lin et al. | |
| 2006/0205214 A1 * | 9/2006 | Shih et al. | 438/682 |
| 2007/0161218 A1 * | 7/2007 | Ichinose et al. | 438/519 |
| 2007/0273042 A1 | 11/2007 | Kuhn et al. | |

FOREIGN PATENT DOCUMENTS

| | | |
|---|---|---|
| JP | 06-216063 | 8/1994 |
| JP | 2004-140262 | 5/2004 |
| JP | 2004-288798 A | 10/2004 |
| JP | 2006-066691 A | 3/2006 |
| KR | 10-0249170 B1 | 12/1999 |
| KR | 1020060079462 | 7/2006 |
| KR | 10-2007-0031611 A | 3/2007 |

* cited by examiner

*Primary Examiner* — Calvin Lee
*Assistant Examiner* — Abul Kalam
(74) *Attorney, Agent, or Firm* — Myers Bigel Sibley & Sajovec

(57) ABSTRACT

Provided are a semiconductor device and a method of forming the same. The method includes forming an interlayer dielectric on a semiconductor substrate, forming a contact hole in the interlayer dielectric to expose the semiconductor substrate, forming a metal pattern including a dopant on the exposed semiconductor substrate, and performing a heat treatment process to react the semiconductor substrate with the metal pattern to form a metal silicide pattern. The heat treatment process includes diffuses the dopant into the semiconductor substrate.

14 Claims, 5 Drawing Sheets

SEMICONDUCTOR DEVICES INCLUDING DOPED METAL SILICIDE PATTERNS AND RELATED METHODS OF FORMING SUCH DEVICES

CROSS-REFERENCE TO RELATED APPLICATIONS

This U.S. non-provisional patent application claims priority under 35 U.S.C. §120 as a divisional of U.S. patent application Ser. No. 12/127,208, filed May 27, 2008, which in turn claims priority under 35 U.S.C. §119 from Korean Patent Application No. 10-2007-0051555, filed on May 28, 2007, the entire contents of each of which is hereby incorporated by reference as if set forth in its entirety.

BACKGROUND

The present invention relates to semiconductor devices and, more particularly, to semiconductor devices that include a metal silicide pattern and to related methods of forming such semiconductor devices.

Most semiconductor devices include one or more switching devices such as one or more MOS transistors. As semiconductor devices become more highly integrated, the dimensions of these MOS transistors (or other switching devices) is scaled down. As the channel length of a MOS transistor is reduced, a "short channel" effect can occur, which can degrade the performance of the transistor. With increasing integration, the depth of the source/drain regions of MOS transistors may also be reduced, which may result in an increase in the sheet resistance of the source/drain regions. In order to reduce the sheet resistance, an ion implantation process may be performed before metal contacts are formed on the source/drain regions. However, this ion implantation process can deteriorate certain characteristics of the MOS transistor. By way of example, the ion implantation process can act to increase the short channel effect due to the implanted dopants.

SUMMARY

Embodiments of the present invention provide methods of forming semiconductor devices in which an interlayer dielectric is formed on a semiconductor substrate. A contact hole is formed in the interlayer dielectric to expose the semiconductor substrate. A metal pattern including a dopant is formed in the contact hole on the exposed semiconductor substrate. A heat treatment process is performed to react the semiconductor substrate with the metal pattern to form a metal silicide pattern and to diffuse some of the dopant into the semiconductor substrate.

In some embodiments, the metal pattern including the dopant may be formed using an electroless plating process. The methods may also include forming a metal contact in the contact hole after forming the metal pattern. In such methods, the heat treatment process may be performed before or after the metal contact is formed.

In some embodiments, the semiconductor substrate may include a PMOS region that has a first source/drain region and an NMOS region that has a second source/drain region. In such embodiments, the contact hole may comprise a first contact hole that exposes the first source/drain region. The method may also include forming a second contact hole in the interlayer dielectric that exposes the second source/drain region. The first metal pattern may comprise a first metal doped with boron (B). Some embodiments of these methods may also include forming a first diffusion barrier pattern and a first metal contact in the first contact hole and forming a second diffusion barrier pattern and a second metal contact in the second contact hole.

In some embodiments, the metal silicide pattern may include cobalt (Co), nickel (Ni), lead (Pd) and/or platinum (Pt). The metal silicide pattern may be between the first source/drain region and the first metal contact. The methods may also include forming a titanium silicide pattern between the second source/drain region and the second metal contact. In some embodiments, the first metal pattern may also be formed on the second source/drain region, and the metal silicide pattern may be formed both between the first source/drain region and the first metal contact and between the second source/drain region and the second metal contact. In other embodiments, the method may instead involve forming a second metal pattern that includes phosphorus (P) on the exposed second source/drain region.

In some embodiments, the methods may include forming a diffusion barrier pattern and a metal contact in each of the first and second contact holes. In such embodiments, the metal silicide pattern may comprise a first metal silicide pattern between the first source/drain region and the metal contact in the first contact hole and a second metal silicide pattern between the second source/drain region and the metal contact in the second contact hole. In such embodiments, the heat treatment process may be performed, for example, after the metal contacts are formed or before the diffusion barrier patterns are formed.

Pursuant to further embodiments of the present invention, methods of forming semiconductor devices are provided in which an interlayer dielectric is formed on a silicon semiconductor substrate. A contact hole is formed in the interlayer dielectric to expose the silicon semiconductor substrate. A metal pattern including a dopant is selectively formed in the contact hole. At least part of the metal pattern including the dopant is converted into a metal silicide pattern. Some of the dopant from the metal pattern is diffused into the silicon semiconductor substrate.

According to still further embodiments of the present invention, semiconductor devices are provided that include an interlayer dielectric on a semiconductor substrate. A metal contact penetrates the interlayer dielectric to be electrically connected to the semiconductor substrate. A metal silicide pattern is provided between the metal contact and the semiconductor substrate. The metal silicide pattern includes a dopant.

In some embodiments, the dopant is boron (B) or phosphorus (P). In some embodiments, the metal silicide pattern includes at least one of cobalt (Co), nickel (Ni), lead (Pd) and platinum (Pt).

In still other embodiments, the semiconductor substrate includes: a PMOS region that has a first gate pattern and a first source/drain region and an NMOS region that has a second gate pattern and a second source/drain region. The metal contact includes a first metal contact that is electrically connected to the first source/drain region and a second metal contact that is electrically connected to the second source/drain region.

In some embodiments, the metal silicide pattern is between the first source/drain region and the first metal contact. In some embodiments, the metal silicide pattern includes a cobalt silicide pattern including boron (B).

In further embodiments, the metal silicide pattern is between the first source/drain region and the first metal contact and between the second source/drain region and the second metal contact.

In even further embodiments, the metal silicide pattern comprises a first metal silicide pattern between the first source/drain region and the first metal contact and a second metal silicide pattern between the second source/drain region and the second metal contact. The first metal silicide pattern may include boron (B) and the second metal silicide pattern may include phosphorus (P).

BRIEF DESCRIPTION OF THE FIGURES

The accompanying figures are included to provide a further understanding of the present invention, and are incorporated in and constitute a part of this specification. The figures illustrate exemplary embodiments of the present invention. In the figures.

DETAILED DESCRIPTION

Figure 1A:
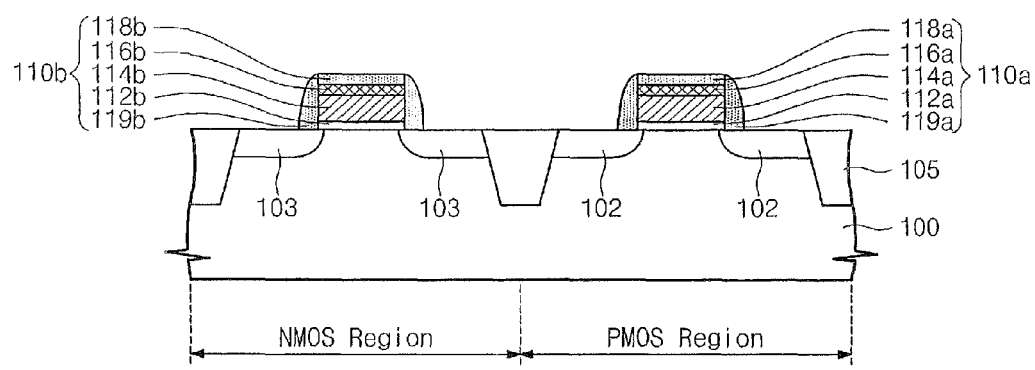
FIGS. 1A through 1C are cross-sectional views illustrating methods of forming semiconductor devices according to some embodiments of the present invention.

Preferred embodiments of the present invention will be described below in more detail with reference to the accompanying figures. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

It will be understood that when a layer is referred to as being "on" another layer or substrate, it can be directly on the other layer or substrate, or intervening layers may also be present. It will also be understood that when a layer is referred to as being "between" two layers, it can be the only layer between the two layers, or one or more additional layers may also be present. Other words used to describe the relationship between elements should be interpreted in a like fashion. Like reference numerals refer to like elements throughout.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It will be also understood that, although the terms first, second, third, and the like may be used herein to describe various regions, materials, and the like, these regions and materials should not be limited by these terms. These terms are only used to distinguish one region or material from another region or material. Thus, a first region or material mentioned in one embodiment could be termed a second region or material in another embodiment. As used herein, the term "and/or" includes any and all combinations of one or more of the associated listed items.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

Herein, source and drain regions may be generically referred to as "source/drain regions," which is a term used to refer to either a source region or a drain region. Herein the term "pattern" is used to refer to both a layer of a semiconductor device as well as a portion of a layer, such as, for example, the portion of a layer that remains after part of the layer is removed or to a material that is selectively deposited or grown such that the material does not comprise a full layer of the device.

Figure 1B:
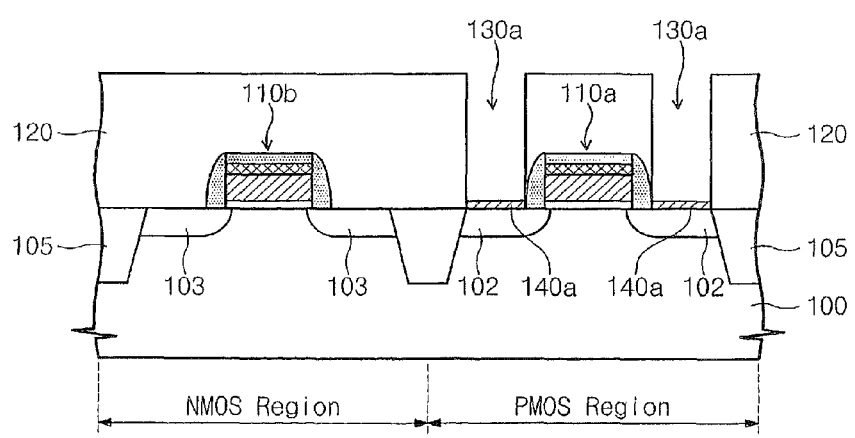
Figure 1C:
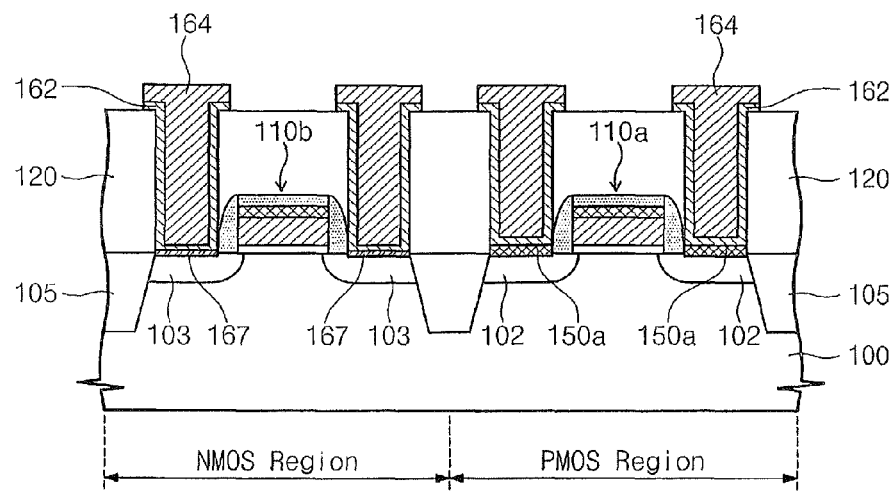

FIGS. 1A through 1C are cross-sectional views illustrating methods of forming semiconductor devices according to certain embodiments of the present invention.

Referring to FIG. 1A, a semiconductor substrate 100 having NMOS and PMOS regions is prepared. A device isolation layer 105 is formed in the semiconductor substrate 100 to define one or more active regions. The semiconductor substrate 100 may comprise, for example, a silicon semiconductor substrate or a silicon semiconductor layer such as a silicon epitaxial layer that is on an underlying conductive or non-conductive substrate. A first gate pattern 110a and first source/drain regions 102 are formed in the PMOS region. The first gate pattern 110a may include a first gate insulation pattern 112a, a first polysilicon pattern 114a, a first metal silicide pattern 116a, a first mask pattern 118a and first spacers 119a. A second gate pattern 110b and second source/drain regions 103 are formed in the NMOS region. The second gate pattern 110b may include a second gate insulation pattern 112b, a second polysilicon pattern 114b, a second metal silicide pattern 116b, a second mask pattern 118b and second spacers 119b.

Referring to FIG. 1B, an interlayer dielectric 120 is formed on the NMOS and PMOS regions. First contact holes 130a are formed in the interlayer dielectric 120 to expose the first source/drain regions 102. First metal patterns 140a that include dopants are formed on the exposed first source/drain regions 102 using, for example, an electroless plating process. The electroless plating process may be performed in such a way that a wafer is immersed in aqueous solution containing metal ions, a reducing agent such as formaldehyde or hydrazine in the aqueous solution donates electrons to convert the metal ions into a metal, and the metal accepting the electrons is selectively deposited on the wafer.

The first metal patterns 140a may include at least one of cobalt (Co), nickel (Ni), lead (Pd) and platinum (Pt). A reducing agent used in the electroless plating process may donate a dopant to the first metal patterns 140a. The dopant may be boron (B). For example, each first metal pattern 140a may be a cobalt-boron (CoB) pattern. An atomic percent of boron (B) may be, for example, in a range of from about 1% to about 30%. The first metal patterns 140a may be formed to a predetermined thickness so that the metal silicide patterns that are formed in a subsequent processing step have a target thickness. For example, the thickness of the first metal patterns 140a may be in a range of from about 10 Angstroms to about 500 Angstroms.

Referring to FIG. 1C, second contact holes (unnumbered in FIG. 1C) are formed in the NMOS region. Next, a diffusion barrier pattern 162 is formed on the sidewalls of each of the first contact holes 130a and on the first metal patterns 140a. Diffusion barrier patterns 162 may also be formed on the sidewalls and bottom surfaces of the second contact holes. The diffusion barrier patterns 162 may also be formed on portions of the upper surface of the interlayer dielectric 120. Metal contacts 164 are formed in the remaining portions of the first contact holes 130a and the second contact holes. The metal contacts 164 may also be formed on portions of the diffusion barrier patterns 162 that are on the upper surface of the interlayer dielectric 120. Each diffusion barrier pattern 162 may have a multilayered structure in which a titanium pattern and a titanium nitride pattern are sequentially stacked. The metal contacts 164 may comprise, for example, tungsten (W) contacts.

After forming the metal contacts 164, first metal silicide patterns 150a may be formed by reacting the first metal patterns 140a with the semiconductor substrate 100 through a heat treatment process. The first metal patterns 140a may be formed to a predetermined thickness so that the first metal silicide patterns 150a may have a target thickness. The first metal silicide patterns 140a may be selectively deposited on the semiconductor substrate 100. As such, it may be unnecessary to perform a process for removing unreacted portions of the first metal patterns 140a. The heat treatment process may be performed after forming the metal contacts 164. In some embodiments, the first metal silicide patterns 150a may comprise cobalt silicide patterns that include boron (B).

In other embodiments, the first metal silicide patterns 150a may be formed through a heat treatment process prior to the formation of the diffusion barrier patterns 162. In some embodiments, at least a portion of the titanium pattern of the diffusion barrier pattern 162 may react with the semiconductor substrate 100 of the second source/drain regions 103 to form titanium silicide patterns 167.

The heat treatment process may be performed at a temperature ranging from about 100° C. to about 1100° C. The heat treatment process may be performed, for example, in a rapid thermal process chamber or an ultra high vacuum chamber. The pressure of a chamber in which the heat treatment process is performed may be in a range of, for example, from about $10^{-8}$ torr to about 5 atm. The heat treatment process may be performed, for example, by convection or conduction. The heat treatment process may be performed, for example, in an inert gas ambient. The inert gas may include argon gas, nitrogen gas and helium gas, and/or mixtures thereof. A hydrogen gas may also be used.

Through the heat treatment process, some of the dopant in the first metal patterns 140a may be diffused into the semiconductor substrate 100. Specifically, the dopant may be diffused into the semiconductor substrate 100 while the first metal silicide patterns 150a are being formed.

Hereinafter, semiconductor devices according to certain embodiments of the present invention will be described with reference to FIG. 1C. As shown in FIG. 1C, a semiconductor substrate 100 having NMOS and PMOS regions is provided. A device isolation layer 105 that defines one or more active regions is provided in the semiconductor substrate 100. A first gate pattern 110a and first source/drain regions 102 are provided in the PMOS region. The first gate pattern 110a may include a first gate insulation pattern 112a, a first polysilicon pattern 114a, a first metal silicide pattern 116a, a first mask pattern 118a and first spacers 119a. A second gate pattern 110b and second source/drain regions 103 are provided in the NMOS region. The second gate pattern 110b may include a second gate insulation pattern 112b, a second polysilicon pattern 114b, a second metal silicide pattern 116b, a second mask pattern 118b and second spacers 119b.

An interlayer dielectric 120 is disposed on the PMOS and NMOS regions. Metal contacts 164 are disposed in the interlayer dielectric 120 to be electrically connected to either a first source/drain region 102 or a second source/drain region 103. A first metal silicide pattern 150a is provided between each first source/drain region 102 and its corresponding metal contact 164. Each first metal silicide pattern 150a may include a dopant. The dopant may be boron (B). The metal in the first metal silicide patterns 150a may be, for example, one of cobalt (Co), nickel (Ni), lead (Pd) and platinum (Pt).

The dopant included in the first metal silicide patterns 150a is not supplied by being diffused from other regions. Instead, the dopant is supplied from the metal patterns that are used to form the first metal silicide patterns 150a. The dopant diffuses into the semiconductor substrate in the vicinity of the interface between the first metal silicide patterns 150a and the semiconductor substrate 100. A diffusion barrier pattern 162 may be provided between each first or second source/drain region 102 and 103 and its corresponding metal contact 164. Each diffusion barrier pattern 162 may have a multilayered structure where a titanium pattern and a titanium nitride pattern are sequentially stacked. As some of the diffusion barrier patterns 162 may be in direct contact with the second source/drain regions 103, some or all of the titanium pattern of the diffusion barrier patterns 162 adjacent the second source/drain regions 103 may react with the semiconductor substrate 100 to provide titanium silicide patterns 167 between the metal contacts 164 and the second source/drain regions 103.

Figure 2A:
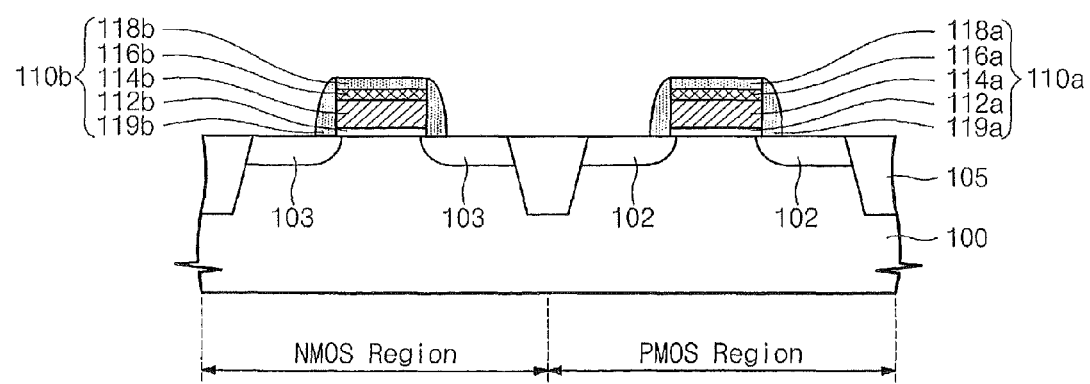
FIGS. 2A through 2C are cross-sectional views illustrating methods of forming semiconductor devices according to further embodiments of the present invention.
Figure 2B:
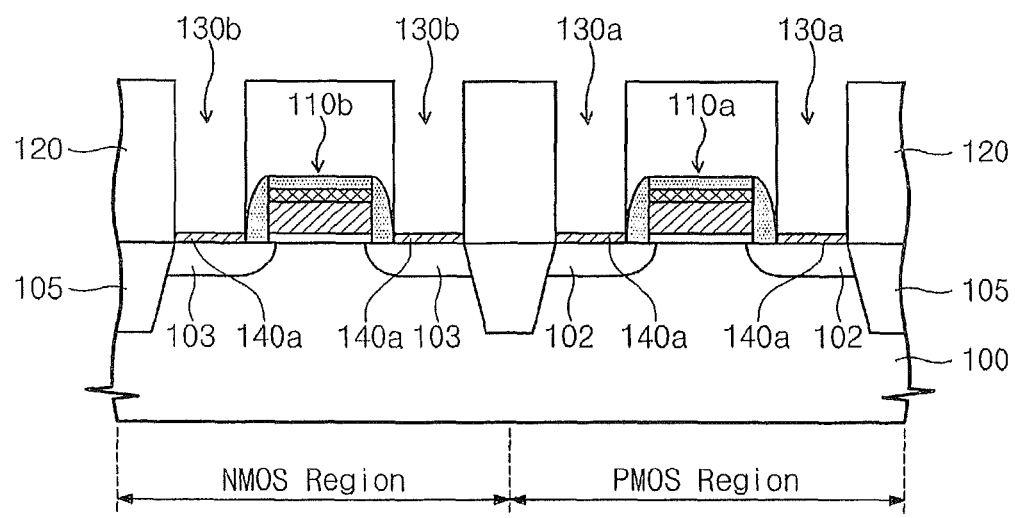
Figure 2C:
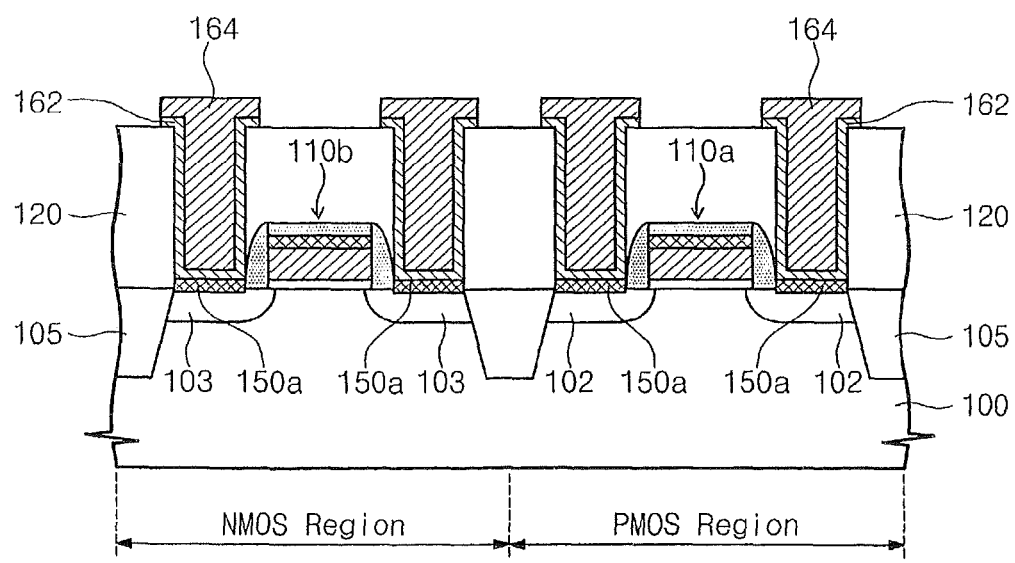

FIGS. 2A through 2C are cross-sectional views illustrating methods of forming semiconductor devices according to further embodiments of the present invention.

Referring to FIG. 2A, a semiconductor substrate 100 having NMOS and PMOS regions is prepared. A device isolation layer 105 is formed in the semiconductor substrate 100 to define one or more active regions. A first gate pattern 110a and first source/drain regions 102 are formed in the PMOS region. The first gate pattern 110a may include a first gate insulation pattern 112a, a first polysilicon pattern 114a, a first metal silicide pattern 116a, a first mask pattern 118a and first spacers 119a. A second gate pattern 110b and second source/drain regions 103 are formed in the NMOS region. The second gate pattern 110b may include a second gate insulation pattern 112b, a second polysilicon pattern 114b, a second metal silicide pattern 116b, a second mask pattern 118b and second spacers 119b.

Referring to FIG. 2B, first contact holes 130a are formed in the PMOS region to expose the first source/drain regions 102. Second contact holes 130b are formed in the NMOS region to expose the second source/drain regions 130. The first and second contact holes 130a and 130b may be formed simultaneously.

A first metal pattern 140a is formed on each exposed first and second source/drain region 102 and 103. The first metal patterns 140a may be formed through an electroless plating process. The first metal patterns 140a may be selectively formed on the exposed first and second source/drain regions 102 and 103.

The first metal patterns 140a may include at least one of cobalt (Co), nickel (Ni), lead (Pd) and platinum (Pt). In one specific embodiment, the first metal patterns 140a may each be a cobalt pattern including boron (B). In another embodiment, the first metal patterns 140a may have a bilayered structure where a cobalt pattern and a cobalt-boron (CoB) pattern are sequentially stacked on the semiconductor substrate 100. The structure of the first metal patterns 140a is not limited to the above-described ones, and thus the first metal patterns 140a may have various different structures, e.g., multilayered structures having a plurality of layers. The first metal patterns 140a may be formed to a predetermined thickness so that subsequently formed metal silicide patterns may have a target thickness. For example, the thickness of the first metal patterns 140a may be in a range of from about 10 Angstroms to about 500 Angstroms.

Referring to FIG. 2C, a diffusion barrier pattern 162 and a metal contact 164 are formed in each of the first and second contact holes 130a and 130b. Each diffusion barrier pattern 162 may have a multilayered structure in which a titanium pattern and a titanium nitride pattern are sequentially stacked. Each metal contact 164 may comprise a tungsten (W) contact. After forming the metal contacts 164, first metal silicide patterns 150a may be formed through a heat treatment process.

The first metal silicide patterns 150a may be formed by reacting the first metal patterns 140a with the semiconductor substrate 100. The first metal patterns 140a may be selectively formed, so that a process for removing an unreacted metal layer may be unnecessary after forming the first metal silicide patterns 150a.

Before forming the diffusion barrier patterns 162, the heat treatment process may be performed. That is, since the removal process of the unreacted metal patterns may be unnecessary, the sequence of the heat treatment process may be arbitrarily set. The heat treatment process may be performed at a temperature ranging from about 100° C. to about 1100° C. The heat treatment process may be performed, for example, in a rapid thermal process chamber or an ultra high vacuum chamber. The pressure of a chamber in which the heat treatment process is performed may be in a range of, for example, from about $10^{-8}$ torr to about 5 atm. The heat treatment process may be performed by convection or conduction. The heat treatment process may be performed, for example, in an inert gas ambient. The inert gas may include argon gas, nitrogen gas, helium gas and/or mixtures thereof. In other embodiments, the heat treatment process may be performed in a hydrogen gas ambient.

The first metal silicide patterns 150a may comprise, for example, cobalt silicide patterns that include boron (B). The operation of forming the first metal silicide patterns 150a may include an operation of diffusing a dopant, e.g., boron (B) into the semiconductor substrate 100. The dopant, e.g., boron (B), diffuses into the semiconductor substrate in the vicinity of the interface between the first metal silicide patterns 150a and the semiconductor substrate 100 in the PMOS region.

In the NMOS region, there may occur a counter doping phenomenon that the dopant, e.g., boron (B) is diffused into the second source/drain region 103. The NMOS region contains a relatively sufficient amount of a dopant compared to the PMOS region, and an ohmic contact is formed in the NMOS region, so that the increase of the sheet resistance is quite small. Thus, characteristics of NMOS and PMOS transistors may not be deteriorated and the sheet resistance of a metal contact can be reduced as well.

Hereinafter, semiconductor devices according to further embodiments of the present invention will be described with reference to FIG. 2C. A semiconductor substrate 100 having NMOS and PMOS regions is provided. A device isolation layer 105 defining one or more active regions is provided in the semiconductor substrate 100. A first gate pattern 110a and first source/drain regions 102 are disposed in the PMOS region. The first gate pattern 110a may include a first gate insulation pattern 112a, a first polysilicon pattern 114a, a first metal silicide pattern 116a, a first mask pattern 118a and first spacers 119a. A second gate pattern 110b and second source/drain regions 103 are disposed in the NMOS region. The second gate pattern 110b may include a second gate insulation pattern 112b, a second polysilicon pattern 114b, a second metal silicide pattern 116b, a second mask pattern 118b and second spacers 119b.

An interlayer dielectric 120 is disposed on the PMOS and NMOS regions. Metal contacts 164 are disposed in the interlayer dielectric 120 to be electrically connected to respective ones of the first and second source/drain regions 102 and 103. First metal silicide patterns 150a are disposed between each first source/drain region 102 and its corresponding metal contact 164, and between each second source/drain region 103 and its corresponding metal contact 164. The first metal silicide patterns 150a each include a dopant. The dopant may be boron (B). The first metal silicide patterns 150a may include one of cobalt (Co), nickel (Ni), lead (Pd) and platinum (Pt).

The dopant included in the first metal silicide patterns 150a is not supplied by being diffused from other regions. Instead, the dopant is supplied from the metal patterns that are used to form the first metal silicide patterns 150a. The dopant, e.g., boron (B), diffuses into the semiconductor substrate in the vicinity of the interface between the first metal silicide patterns 150a and the semiconductor substrate 100 in the PMOS region. A diffusion barrier pattern 162 may be disposed between each first and second source/drain region 102 and 103 and its corresponding metal contact 164. The diffusion barrier patterns 162 may each have a multilayered structure where a titanium pattern and a titanium nitride pattern are sequentially stacked.

Hereinafter, methods of forming semiconductor devices according to still further embodiments of the present invention will be described with reference to FIGS. 3A through 3C.

Figure 3A:
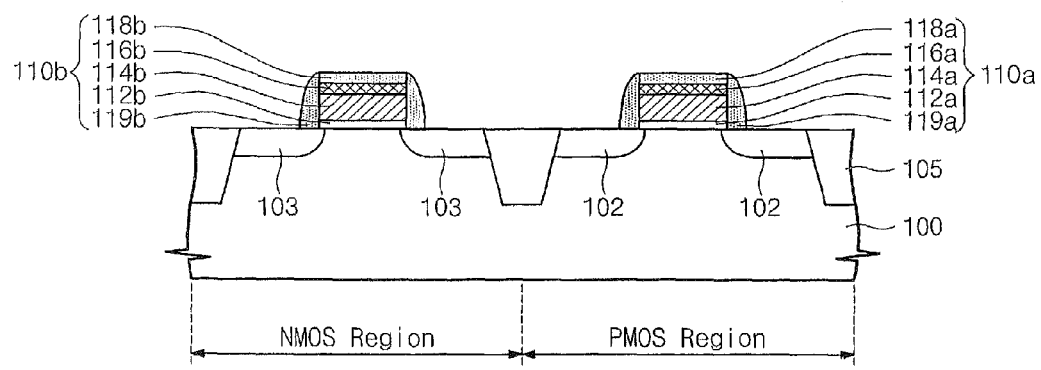
FIGS. 3A through 3D are cross-sectional views illustrating methods of forming semiconductor devices according to still further embodiments of the present invention.

Referring to FIG. 3A, a semiconductor substrate 100 having NMOS and PMOS regions is prepared. A device isolation layer 105 is formed in the semiconductor substrate 100 to define one or more active regions. A first gate pattern 110a and first source/drain regions 102 are formed in the PMOS region. The first gate pattern 110a may include a first gate insulation pattern 112a, a first polysilicon pattern 114a, a first metal silicide pattern 116a, a first mask pattern 118a and first spacers 119a. A second gate pattern 110b and second source/drain regions 103 are formed in the NMOS region. The second gate pattern 110b may include a second gate insulation pattern 112b, a second polysilicon pattern 114b, a second metal silicide pattern 116b, a second mask pattern 118b and second spacers 119b.

Figure 3B:
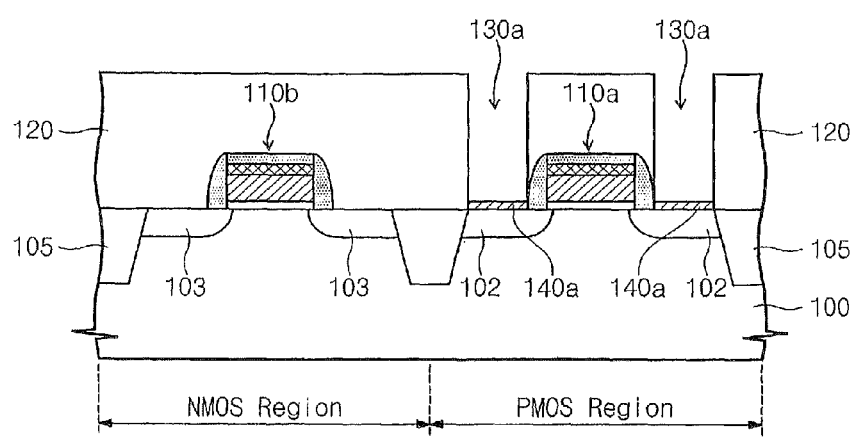

Referring to FIG. 3B, first contact holes 130a are formed in an interlayer dielectric 120 to expose the first source/drain regions 102. First metal patterns 140a are formed on each exposed first source/drain region 102. The first metal patterns 140a may be formed through an electroless plating process.

The first metal patterns 140a may be selectively formed on the exposed first source/drain regions 102.

The first metal patterns 140a may include at least one of cobalt (Co), nickel (Ni), lead (Pd) and platinum (Pt). The first metal patterns 140a may be formed of a cobalt pattern including a first dopant, e.g., boron (B). In some embodiments, the first metal patterns 140a may have a multilayered structure where a cobalt pattern and a cobalt-boron (CoB) pattern are sequentially stacked on the semiconductor substrate 100. The structure of the first metal patterns 140a is not limited to the above-described structures, so that the first metal patterns 140a may have various different structures, e.g., a plurality of layers. The first metal patterns 140a may be formed to a predetermined thickness so that subsequently formed metal silicide patterns may have a target thickness. For example, the thickness of the first metal patterns 140a may be in a range of from about 10 Angstroms to about 500 Angstroms.

Figure 3C:
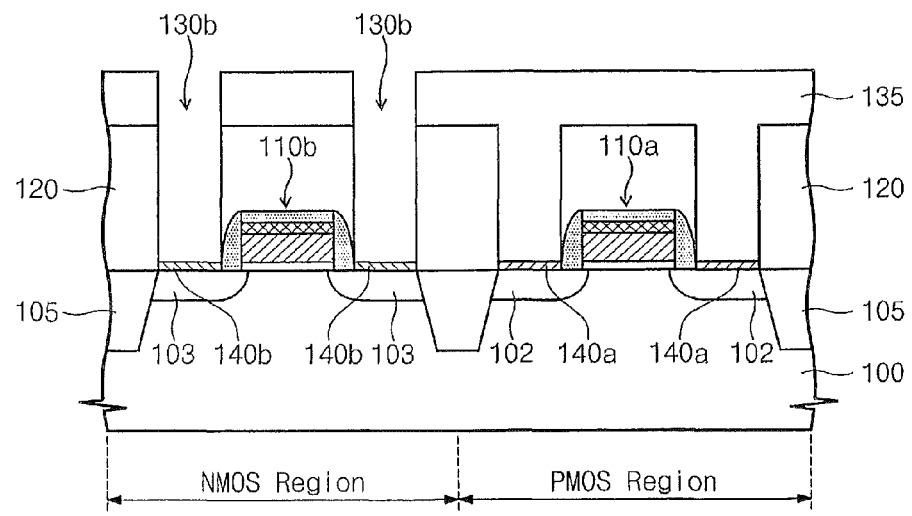

Referring to FIG. 3C, second contact holes 130b are formed in the interlayer dielectric 120 to expose the second source/drain regions 103. The second contact holes 130b may be formed by forming a photoresist pattern 135 and etching the photoresist pattern 135. The first contact holes 130a may not be exposed because they may be shielded by the photoresist pattern 135.

Second metal patterns 140b may be selectively formed on the exposed second source/drain regions 103. The second metal patterns 140b may be formed through an electroless plating process. The second metal patterns 140b may include at least one of cobalt (Co), nickel (Ni), lead (Pd) and platinum (Pt). The second metal patterns 140b may include a second dopant, e.g., phosphorus (P). The second dopant may be supplied from a reducing agent used in the electroless plating process. The second metal patterns 140b may be formed of a cobalt-phosphorus (CoP) pattern. A formation sequence of the first and second metal patterns 140a and 140b are not limited to the above-described one.

Figure 3D:
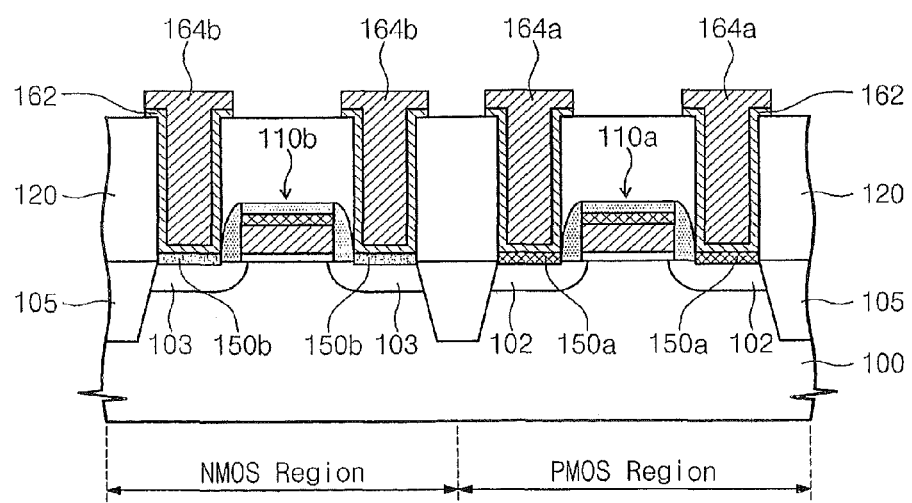

Referring to FIG. 3D, after removing the photoresist pattern 135, a diffusion barrier pattern 162 is formed in each of the first and second contact holes 130a and 130b, and then first and second metal contacts 164a and 164b are formed in the first and second contact holes 130a and 130b, respectively. The diffusion barrier patterns 162 may have a multilayered structure where a titanium pattern and a titanium nitride pattern are sequentially stacked. The first and second metal contacts 164a and 164b may comprise tungsten (W).

After forming the first and second metal contacts 164a and 164b, first and second metal silicide patterns 150a and 150b may be formed through a heat treatment process. The first metal silicide patterns 150a may be formed by reacting the metal patterns 140a with the semiconductor substrate 100. The second metal silicide patterns 150b may be formed by reacting the second metal pattern 140b with the semiconductor substrate 100. The first and second metal patterns 140a and 140b may be selectively formed, so that a process for removing an unreacted metal layer may be unnecessary after forming the first and second metal silicide patterns 150a and 150b.

Before forming the diffusion barrier patterns 162, the heat treatment process may be performed. That is, since the removal process of the unreacted metal layer is unnecessary, the sequence of the heat treatment process may be arbitrarily set. The heat treatment process may be performed at a temperature ranging from, for example, about 100° C. to about 1100° C. The heat treatment process may be performed, for example, in a rapid thermal process chamber or an ultra high vacuum chamber. The pressure of a chamber in which the heat treatment process is performed may be, for example, in a range of from about $10^{-8}$ torr to about 5 atm. The heat treatment process may be performed by convection or conduction. The heat treatment process may be performed, for example, in an inert gas ambient. The inert gas may include argon gas, nitrogen gas, helium gas and/or a mixture thereof. In other embodiments the heat treatment process may be performed in a hydrogen gas ambient.

The first metal silicide patterns 150a may comprise, for example, cobalt silicide patterns that include boron (B). The operation of forming the first metal silicide patterns 150a may include an operation of diffusing the first dopant, e.g., boron (B) into the semiconductor substrate 100. The dopant, e.g., boron (B), diffuses into the semiconductor substrate in the vicinity of the interface between the first metal silicide patterns 150a and the semiconductor substrate 100 in the PMOS region.

The second metal silicide patterns 150b may comprise, for example, cobalt silicide patterns that include phosphorus (P). The operation of forming the second metal silicide patterns 150b may include an operation of diffusing the second dopant, e.g., phosphorus (P) into the semiconductor substrate 100. Appropriate dopants are provided in the first and second source/drain regions 102 and 103, respectively, reducing the sheet resistance thereof.

Hereinafter, semiconductor devices according to still further embodiments of the present invention will be described with reference to FIG. 3D. A semiconductor substrate 100 having NMOS and PMOS regions is provided. A device isolation layer 105 defining one or more active regions is provided in the semiconductor substrate 100. A first gate pattern 110a and first source/drain regions 102 are disposed in the PMOS region. The first gate pattern 110a may include a first gate insulation pattern 112a, a first polysilicon pattern 114a, a first metal silicide pattern 116a, a first mask pattern 118a and first spacers 119a. A second gate pattern 110b and second source/drain regions 103 are disposed in the NMOS region. The second gate pattern 110b may include a second gate insulation pattern 112b, a second polysilicon pattern 114b, a second metal silicide pattern 116b, a second mask pattern 118b and second spacers 119b.

An interlayer dielectric 120 is disposed on the PMOS and NMOS regions. First and second metal contacts 164a and 164b are disposed in the interlayer dielectric 120 to be electrically connected to the first and second source/drain regions 102 and 103, respectively. A first metal silicide pattern 150a is disposed between each first source/drain region 102 and its corresponding first metal contact 164a. The first metal silicide patterns 150a each include a first dopant. The first dopant may be boron (B). A second metal silicide pattern 150b is disposed between each second source/drain region 103 and its corresponding second metal contact 164b. The second metal silicide patterns 150b also include a second dopant. The second dopant may be phosphorus (P). The first metal silicide patterns 150a may include one of cobalt (Co), nickel (Ni), lead (Pd) and platinum (Pt).

The first and second dopants included in the first and second metal silicide patterns 150a and 150b, respectively, are not supplied by being diffused from other regions. That is, the first and second dopants are respectively supplied from first and second metal patterns that are used to form the first and second metal silicide patterns 150a and 150b. The first dopant, e.g., boron (B), diffuses into the semiconductor substrate in the vicinity of the interface between the first metal silicide patterns 150a and the semiconductor substrate 100 in the PMOS region. The second dopant, e.g., phosphorous (P), diffuses into the semiconductor substrate in the vicinity of the interface between the second metal silicide patterns 150b and the semiconductor substrate 100 in the NMOS region. A diffusion barrier pattern 162 may be disposed between the first and second source/drain regions 102 and 103 and their corresponding first or second metal contacts 164a and 164b. The diffusion barrier patterns 162 may each have a multilayered structure where a titanium pattern and a titanium nitride pattern are sequentially stacked.

According to embodiments of the present invention, a dopant is provided in a metal pattern used to form a metal silicide pattern. The metal pattern may be selectively formed through, for example, an electroless plating process. While the metal silicide pattern is being formed, the dopant is provided into a semiconductor substrate. Therefore, the characteristic of a transistor may be maintained and/or the sheet resistance can be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of forming a semiconductor device, the method comprising:
    providing a semiconductor substrate having a PMOS region;
    forming a gate pattern on the PMOS region of the semiconductor substrate, the gate pattern including a first metal silicide pattern;
    forming a first source/drain region in the PMOS region of the semiconductor substrate;
    forming a spacer on a sidewall of the gate pattern, the spacer covering a portion of the first source/drain region;
    forming an interlayer dielectric that covers the gate pattern and the first source/drain region;
    forming a contact hole in the interlayer dielectric that exposes a portion of the semiconductor substrate;
    selectively forming a metal pattern that includes a dopant in the contact hole on the exposed portion of the semiconductor substrate; and
    performing a heat treatment process to react the semiconductor substrate with the metal pattern to form a metal silicide pattern while diffusing some of the dopant into the semiconductor substrate.

2. The method of claim 1, wherein forming the metal pattern that includes the dopant comprises forming the metal pattern that includes the dopant using an electroless plating process.

3. The method of claim 1, further comprising the following that are performed after the heat treatment process:
    forming a diffusion barrier pattern in the first contact hole, and then
    forming a metal contact in the contact hole.

4. The method of claim 1, further comprising forming a metal contact in the contact hole after forming the metal pattern, wherein the heat treatment process is performed after the metal contact is formed.

5. The method of claim 1, wherein the semiconductor substrate further comprises an NMOS region, the method further comprising:
    forming a second gate pattern on the NMOS region of the semiconductor substrate, the second gate pattern including a second metal silicide pattern;
    forming a second source/drain region in the NMOS region of the semiconductor substrate;
    forming a second spacer on a sidewall of the second gate pattern, the second spacer covering a portion of the second source/drain region;
    wherein the contact hole comprises a first contact hole that exposes the first source/drain region,
    wherein the metal pattern comprises a first metal pattern that is formed through an electroless plating process,
    and wherein the method further comprises forming a second contact hole in the interlayer dielectric that exposes the second source/drain region.

6. The method of claim 5, wherein the first metal pattern comprises a first metal doped with boron (B).

7. The method of claim 6, further comprising forming a first diffusion barrier pattern and a first metal contact in the first contact hole and forming a second diffusion barrier pattern and a second metal contact in the second contact hole.

8. The method of claim 7, wherein the metal silicide pattern includes cobalt (Co), nickel (Ni), lead (Pd) and/or platinum (Pt) and is between the first source/drain region and the first metal contact; and
    wherein the method further comprises forming a titanium silicide pattern between the second source/drain region and the second metal contact.

9. The method of claim 7, wherein the first metal pattern is also formed on the second source/drain region, and the metal silicide pattern is formed between the first source/drain region and the first metal contact, and between the second source/drain region and the second metal contact.

10. The method of claim 5, wherein the first metal pattern comprises a first metal doped with boron (B), the method further comprising forming a second metal pattern that includes phosphorus (P) on the exposed second source/drain region.

11. The method of claim 10, further comprising forming a diffusion barrier pattern and a metal contact in each of the first and second contact holes.

12. The method of claim 11, wherein the metal silicide pattern comprises:
    a first metal silicide pattern between the first source/drain region and the metal contact in the first contact hole; and
    a second metal silicide pattern between the second source/drain region and the metal contact in the second contact hole.

13. The method of claim 11, wherein the heat treatment process is performed after the metal contacts are formed.

14. The method of claim 11, wherein the heat treatment process is performed before the diffusion barrier patterns are formed.

* * * * *